(12) United States Patent
Zheng et al.

(10) Patent No.: US 11,847,966 B2
(45) Date of Patent: Dec. 19, 2023

(54) SHIFT REGISTER AND DRIVING METHOD THEREFOR, AND DISPLAY APPARATUS

(71) Applicant: BOE TECHNOLOGY GROUP CO., LTD., Beijing (CN)

(72) Inventors: Haoliang Zheng, Beijing (CN); Minghua Xuan, Beijing (CN); Dongni Liu, Beijing (CN); Zhenyu Zhang, Beijing (CN); Li Xiao, Beijing (CN); Liang Chen, Beijing (CN); Hao Chen, Beijing (CN); Jiao Zhao, Beijing (CN); Lijun Yuan, Beijing (CN); Yi Ouyang, Beijing (CN); Qi Qi, Beijing (CN)

(73) Assignee: Boe Technology Group Co., LTD., Beijing (CN)

( * ) Notice: Subject to any disclaimer, the term of this patent is extended or adjusted under 35 U.S.C. 154(b) by 21 days.

(21) Appl. No.: 17/760,733

(22) PCT Filed: Mar. 18, 2021

(86) PCT No.: PCT/CN2021/081629
§ 371 (c)(1),
(2) Date: Mar. 15, 2022

(87) PCT Pub. No.: WO2021/185328
PCT Pub. Date: Sep. 23, 2021

(65) Prior Publication Data
US 2022/0335889 A1 Oct. 20, 2022

(30) Foreign Application Priority Data
Mar. 19, 2020 (CN) .......................... 202010197530.5

(51) Int. Cl.
*G09G 3/3233* (2016.01)
*G11C 19/28* (2006.01)

(52) U.S. Cl.
CPC ........... *G09G 3/3233* (2013.01); *G11C 19/28* (2013.01); *G09G 2300/043* (2013.01);
(Continued)

(58) Field of Classification Search
None
See application file for complete search history.

(56) References Cited

U.S. PATENT DOCUMENTS

| 9,634,678 B1* | 4/2017 | Caffee ..................... H03L 7/187 |
| 2004/0051591 A1* | 3/2004 | Okada ..................... H03L 7/099 |
| | | 331/16 |

(Continued)

FOREIGN PATENT DOCUMENTS

| CN | 102708799 A | 10/2012 |
| CN | 103247247 A | 8/2013 |

(Continued)

OTHER PUBLICATIONS

The First Office Action for Chinese Patent Application No. 202010197530.5 issued by the Chinese Patent Office dated Dec. 8, 2020.

(Continued)

*Primary Examiner* — Dorothy Harris
(74) *Attorney, Agent, or Firm* — IP & T GROUP LLP

(57) ABSTRACT

A shift register (SR) includes a voltage control circuit (110) and a bias compensation circuit (120). The voltage control circuit (110) is configured to control a voltage at a first node (Output) to be a first voltage or a second voltage. The bias compensation circuit (120) is configured to: when the voltage at the first node (Output) is the first voltage, transmit a first signal received by a first signal terminal (VDD-A) to a first signal output terminal (EM1), and transmit a second signal received by a second signal terminal (VDD-B) to a second signal output terminal (EM2); and in response to the (Continued)

voltage at the first node (Output) being the second voltage, transmit a signal received by a first voltage terminal (LVGL1) to the first signal output terminal (EM1) and the second signal output terminal (EM2).

20 Claims, 7 Drawing Sheets

(52) U.S. Cl.
CPC ............... *G09G 2300/0426* (2013.01); *G09G 2300/0819* (2013.01); *G09G 2300/0842* (2013.01); *G09G 2310/0286* (2013.01); *G09G 2310/08* (2013.01)

(56) References Cited

U.S. PATENT DOCUMENTS

| | | |
|---|---|---|
| 2006/0055644 A1 | 3/2006 | Ryu et al. |
| 2006/0244388 A1* | 11/2006 | Chung ................. G09G 3/3266 315/169.3 |
| 2011/0057864 A1 | 3/2011 | Chung |
| 2011/0090184 A1* | 4/2011 | Yamazaki ............... G11C 19/28 326/88 |
| 2013/0207940 A1 | 8/2013 | Song et al. |
| 2014/0111403 A1 | 4/2014 | Kim et al. |
| 2015/0002560 A1 | 1/2015 | Kwon et al. |
| 2016/0012774 A1 | 1/2016 | Ohara et al. |
| 2017/0187360 A1* | 6/2017 | Uesugi ................. G09G 3/3648 |
| 2018/0233090 A1 | 8/2018 | Zhang |
| 2018/0293924 A1 | 10/2018 | Wang |
| 2019/0206311 A1* | 7/2019 | Yu .............................. G09G 3/20 |
| 2020/0027515 A1 | 1/2020 | Gu et al. |
| 2020/0075113 A1* | 3/2020 | Yuan ....................... G11C 19/28 |
| 2021/0217352 A1 | 7/2021 | Xuan et al. |
| 2021/0390904 A1 | 12/2021 | Xuan et al. |

FOREIGN PATENT DOCUMENTS

| | | |
|---|---|---|
| CN | 104252835 A | 12/2014 |
| CN | 104299583 A | 1/2015 |
| CN | 105074808 A | 11/2015 |
| CN | 105719599 A | 6/2016 |
| CN | 106356015 A | 1/2017 |
| CN | 106782337 A | 5/2017 |
| CN | 107170408 A | 9/2017 |
| CN | 108877716 A | 11/2018 |
| CN | 109003574 A | 12/2018 |
| CN | 109979381 A | 7/2019 |
| CN | 110226195 A | 9/2019 |
| CN | 110391267 A | 10/2019 |
| CN | 111243516 A | 6/2020 |
| EP | 1821282 A2 | 8/2007 |

OTHER PUBLICATIONS

The Second Office Action for Chinese Patent Application No. 202010197530.5 issued by the Chinese Patent Office dated May 11, 2021.

* cited by examiner

SHIFT REGISTER AND DRIVING METHOD THEREFOR, AND DISPLAY APPARATUS

CROSS-REFERENCE TO RELATED APPLICATIONS

This application is a national phase entry under 35 USC 371 of International Patent Application No. PCT/CN2021/081629 filed on Mar. 18, 2021, which claims priority to Chinese Patent Application No. 202010197530.5, filed on Mar. 19, 2020, which are incorporated herein by reference in their entirety.

TECHNICAL FIELD

The present disclosure relates to the field of display technologies, and in particular, to a shift register and a driving method therefor, and a display apparatus.

BACKGROUND

In recent years, display apparatuses based on organic light-emitting diodes (OLEDs) have become popular display products at home and abroad due to their advantages of self-luminescence, wide viewing angle, high luminous efficiency, wide color gamut, low operating voltage, thin panel and the like.

SUMMARY

In an aspect, a shift register is provided. The shift register includes a voltage control circuit and a bias compensation circuit. The voltage control circuit is coupled to a first node, and is configured to control a voltage at the first node to be one of a first voltage and a second voltage. The bias compensation circuit is coupled to the first node, a first voltage terminal, a first signal terminal, a second signal terminal, a first signal output terminal and a second signal output terminal, and is configured to: when the voltage at the first node is the first voltage, transmit a first signal received by the first signal terminal to the first signal output terminal, and transmit a second signal received by the second signal terminal to the second signal output terminal; and in response to the voltage at the first node being the second voltage, transmit a signal received by the first voltage terminal to the first signal output terminal and the second signal output terminal.

In some embodiments, the bias compensation circuit includes a third switching element, a fourth switching element, a fifth switching element and a sixth switching element. A control electrode of the third switching element is coupled to the first signal terminal or a third voltage terminal, a first electrode of the third switching element is coupled to the first signal terminal, and a second electrode of the third switching element is coupled to the first signal output terminal. A control electrode of the fourth switching element is coupled to the first node, a first electrode of the fourth switching element is coupled to the first signal output terminal, and a second electrode of the fourth switching element is coupled to the first voltage terminal. A control electrode of the fifth switching element is coupled to the second signal terminal or the third voltage terminal, a first electrode of the fifth switching element is coupled to the second signal terminal, and a second electrode of the fifth switching element is coupled to the second signal output terminal. A control electrode of the sixth switching element is coupled to the first node, a first electrode of the sixth switching element is coupled to the second signal output terminal, and a second electrode of the sixth switching element is coupled to the first voltage terminal. The third voltage terminal is configured to provide a signal for controlling the third switching element and the fifth switching element to be in turn-on states.

In some embodiments, the voltage control circuit includes an output sub-circuit and a denoising sub-circuit. The output sub-circuit is coupled to a clock signal terminal, a second node and the first node, and is configured to transmit a clock signal received by the clock signal terminal to the first node in response to a voltage at the second node, so as to make the voltage at the first node be the first voltage or the second voltage. The denoising sub-circuit is coupled to the first voltage terminal, the first node and a third node, and is configured to control the voltage at the first node to be the first voltage in response to a voltage at the third node.

In some embodiments, the output sub-circuit includes an eleventh switching element. A control electrode of the eleventh switching element is coupled to the second node, a first electrode of the eleventh switching element is coupled to the clock signal terminal, and a second electrode of the eleventh switching element is coupled to the first node.

In some embodiments, the output sub-circuit is further configured to raise or lower the voltage at the second node in response to the voltage at the first node being the second voltage.

In some embodiments, the output sub-circuit further includes an energy storage element. A first electrode plate of the energy storage element is coupled to the first node, and a second electrode plate of the energy storage element is coupled to the second node.

In some embodiments, the output sub-circuit is further coupled to a third signal output terminal, and is further configured to transmit the clock signal received by the clock signal terminal to the third signal output terminal in response to the voltage at the second node.

In some embodiments, the output sub-circuit further includes a tenth switching element. A control electrode of the tenth switching element is coupled to the second node, a first electrode of the tenth switching element is coupled to the clock signal terminal, and a second electrode of the tenth switching element is coupled to the third signal output terminal.

In some embodiments, the denoising sub-circuit includes a seventeenth switching element. A control electrode of the seventeenth switching element is coupled to the third node, a first electrode of the seventeenth switching element is coupled to the first node, and a second electrode of the seventeenth switching element is coupled to the first voltage terminal.

In some embodiments, the denoising sub-circuit is further coupled to a third signal terminal, and is further configured to transmit a third signal received by the third signal terminal to the third node in response to the third signal received by the third signal terminal.

In some embodiments, the denoising sub-circuit further includes a fifteenth switching element. A control electrode and a first electrode of the fifteenth switching element are both coupled to the third signal terminal, and a second electrode of the fifteenth switching element is coupled to the third node.

In some embodiments, the denoising sub-circuit is further coupled to a second voltage terminal and a third signal output terminal, and is further configured to transmit a signal received by the second voltage terminal to the third signal output terminal in response to the voltage at the third node.

In some embodiments, the denoising sub-circuit further includes a sixteenth switching element. A control electrode of the sixteenth switching element is coupled to the third node, a first electrode of the sixteenth switching element is coupled to the third signal output terminal, and a second electrode of the sixteenth switching element is coupled to the second voltage terminal.

In some embodiments, the shift register further includes an input circuit. The input circuit is coupled to a signal input terminal, a second node, a third node and a second voltage terminal, and is configured to control a voltage at the second node and a voltage at the third node in response to an input signal received by the signal input terminal.

In some embodiments, the input circuit includes a seventh switching element and a ninth switching element. A control electrode and a first electrode of the seventh switching element are both coupled to the signal input terminal, and a second electrode of the seventh switching element is coupled to the second node. A control electrode of the ninth switching element is coupled to the second node, a first electrode of the ninth switching element is coupled to the third node, and a second electrode of the ninth switching element is coupled to the second voltage terminal.

In some embodiments, the input circuit further includes an eighth switching element. A control electrode of the eighth switching element is coupled to the signal input terminal, a first electrode of the eighth switching element is coupled to the third node, and a second electrode of the eighth switching element is coupled to the second voltage terminal.

In some embodiments, the shift register further includes a reset circuit. The reset circuit is coupled to a first reset signal terminal, a second node and a second voltage terminal, and is configured to transmit a signal received by the second voltage terminal to the second node in response to a first reset signal received by the first reset signal terminal.

In some embodiments, the reset circuit includes a thirteenth switching element. A control electrode of the thirteenth switching element is coupled to the first reset signal terminal, a first electrode of the thirteenth switching element is coupled to the second voltage terminal, and a second electrode of the thirteenth switching element is coupled to the second node.

In some embodiments, the reset circuit is further coupled to a second reset signal terminal and the first voltage terminal, and the reset circuit is further configured to: transmit the signal received by the second voltage terminal to the second node in response to a second reset signal received by the second reset signal terminal; and transmit the signal received by the first voltage terminal to the first node in response to the second reset signal received by the second reset signal terminal, so as to make the voltage at the first node be the first voltage.

In some embodiments, the reset circuit further includes a twelfth switching element and a fourteenth switching element. A control electrode of the twelfth switching element is coupled to the second reset signal terminal, a first electrode of the twelfth switching element is coupled to the second node, and a second electrode of the twelfth switching element is coupled to the second voltage terminal. A control electrode of the fourteenth switching element is coupled to the second reset signal terminal, a first electrode of the fourteenth switching element is coupled to the first node, and a second electrode of the fourteenth switching element is coupled to the first voltage terminal.

In another aspect, a display apparatus is provided. The display apparatus includes the shift register described in any of the above embodiments and a pixel driving circuit. The pixel driving circuit includes a first switching element and a second switching element. A control electrode of the first switching element is coupled to the first signal output terminal of the shift register, and a control electrode of the second switching element is coupled to the second signal output terminal of the shift register. A first electrode of the first switching element is coupled to a first electrode of the second switching element, and a second electrode of the first switching element is coupled to a second electrode of the second switching element.

In yet another aspect, a driving method for a shift register is provided. The shift register is coupled to a first node, a first signal terminal, a second signal terminal, a first signal output terminal, a second signal output terminal and a first voltage terminal. The driving method for the shift register includes:

controlling a voltage at the first node to be one of a first voltage and a second voltage;

when the voltage at the first node is the first voltage, transmitting a first signal received by the first signal terminal to the first signal output terminal, and transmitting a second signal received by the second signal terminal to the second signal output terminal; and in response to the voltage at the first node being the second voltage, transmitting a signal received by the first voltage terminal to the first signal output terminal and the second signal output terminal.

The first signal and the second signal are both rectangular wave signals, and have opposite levels.

In some embodiments, the first signal and the second signal are both square wave signals.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
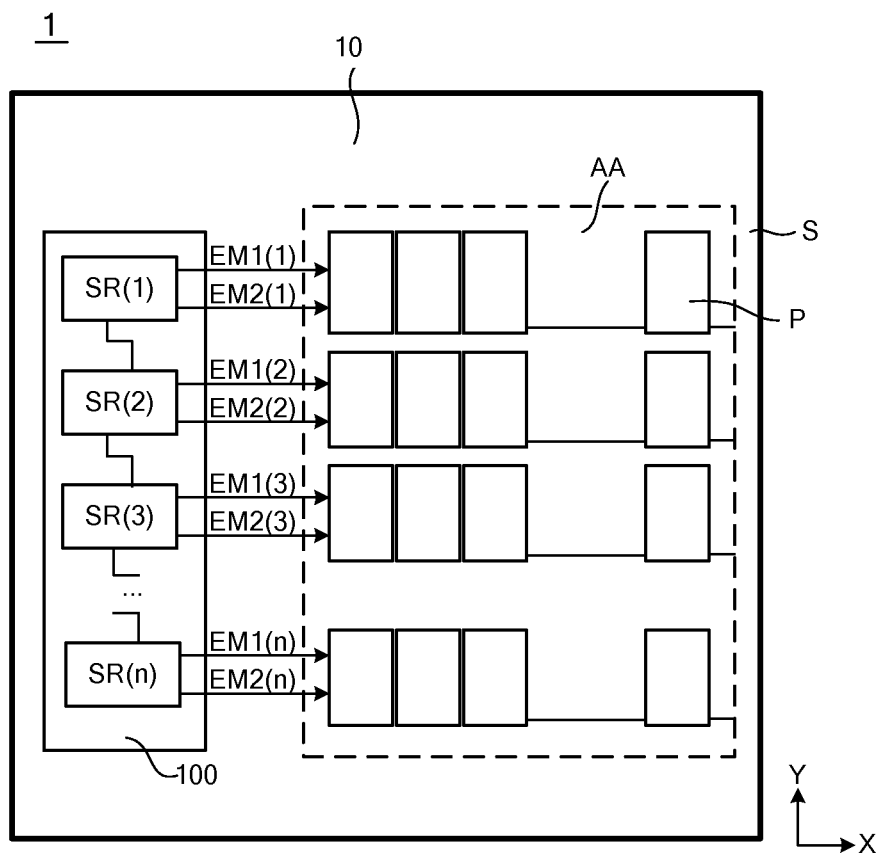
FIG. 1 is a diagram showing a structure of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms do not necessarily refer to the same embodiment(s) or examples(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined as "first" or "second" may explicitly or implicitly include one or more of the features. In the description of the embodiments of the present disclosure, the term "a plurality of" or "the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if", depending on the context, is optionally construed as "when" or "in a case where" or "in response to determining that" or "in response to detecting". Similarly, depending on the context, the phrase "if it is determined" or "if [a stated condition or event] is detected" is optionally construed as "in a case where it is determined that" or "in response to determining that" or "in a case where [the stated condition or event] is detected" or "in response to detecting [the stated condition or event]".

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Exemplary embodiments are described herein with reference to sectional views and/or plan views as idealized exemplary drawings. In the accompanying drawings, thickness of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus. For example, the display apparatus may be any apparatus that displays images whether in motion (such as a video) or fixed (such as a still image), and regardless of text or image. More specifically, the display apparatus may be one of a variety of electronic devices, and the described embodiments may be implemented in or associated with a variety of electronic devices. The variety of electronic devices may include (but are not limit to), for example, mobile telephones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, television (TV) monitors, flat-panel displays, computer monitors, car displays (e.g., odometer displays), navigators, cockpit controllers and/or displays, camera view displays (e.g., displays of rear view cameras in vehicles), electronic photos, electronic billboards or signs, projectors, architectural structures, packagings and aesthetic structures (e.g., displays for displaying an image of a piece of jewelry), etc. The embodiments of the present disclosure do not particularly limit a specific form of the display apparatus.

The display apparatus 1 provided by some embodiments of the present disclosure may include a display panel 10. As show in FIG. 1, the display panel 10 has a display area (also refered to as an active area) AA and a peripheral area S located on at least one side of the active area.

The active area AA of the display panel 10 is provided with a plurality of sub-pixels P therein. The plurality of sub-pixels P are sequentially arranged in the active area AA, and an arrangement thereof may be designed according to actual situations. For example, as show in FIG. 1, the plurality of sub-pixels P are arranged in an array, and sub-pixels P arranged in a line in an X direction are referred to as a same row of sub-pixels, and sub-pixels P arranged in a line in a Y direction are referred to as a same column of sub-pixels.

The peripheral area S of the display panel 10 is provided with a light-emitting control driving circuit 100 therein. The light-emitting control driving circuit 100 includes a plurality of shift registers SR(1) to SR(n), n is a positive integer. Each shift register is coupled to a row of sub-pixels, and is used to output a first light-emitting control signal and a second light-emitting control signal to the row of sub-pixels.

For example, the display panel 10 further includes a plurality of light-emitting signal lines (e.g., 2n light-emitting signal lines). For example, as shown in FIG. 1, the plurality of light-emitting signal lines EM1(1) to EM1(n) and EM2(1) to EM2(n) extend along the X direction, and light-emitting signal lines EM1(1) to EM1(n) and light-emitting signal lines EM2(1) to EM2(n) are respectively configured to transmit first light-emitting control signals and second light-emitting control signals. For example, the plurality of sub-pixels in the display panel 10 are divided into n rows of sub-pixels, in which an ith row of sub-pixels is coupled to an ith-stage shift register SR(i) through two light-emitting signal lines (i is greater than or equal to 1 and less than or equal to n, and i is an integer), so that the shift register SR(i) may transmit a first light-emitting control signal and a second light-emitting control signal to the ith row of sub-pixels through the two light-emitting signal lines.

Figure 2:
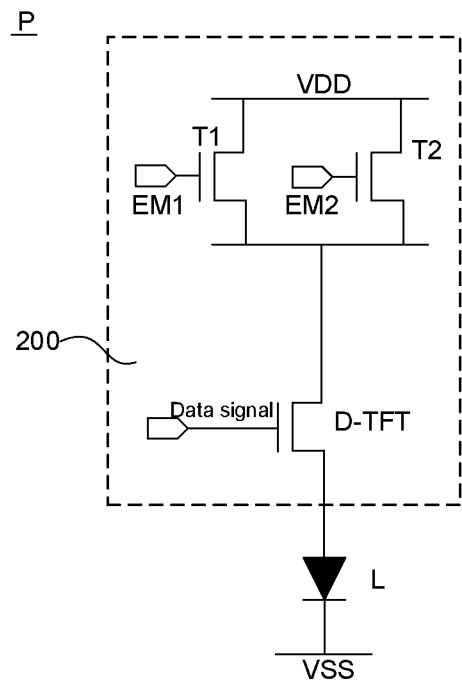
FIG. 2 is a diagram showing a structure of a sub-pixel of a display panel in a display apparatus, in accordance with some embodiments.

As shown in FIG. 2, at least one sub-pixel P (e.g., each sub-pixel P) includes a pixel driving circuit 200 and a light-emitting device L. The pixel driving circuit 200 is coupled to the light-emitting device L. The pixel driving circuit 200 is configured to drive the light-emitting device L to emit light. The arrangement of the plurality of sub-pixels P may refer to an arrangement of pixel driving circuits in the plurality of sub-pixels P. That is, the plurality of pixel driving circuits may be arranged in an array.

The light-emitting device L may be an organic light-emitting diode (abbreviated as OLED), a quantum dot light-emitting diode (abbreviated as QLED), or the like. The light-emitting device L includes a cathode and an anode, and a light-emitting functional layer located between the cathode and the anode. The light-emitting functional layer may include, for example, a light-emitting layer, a hole transporting layer (HTL) located between the light-emitting layer and the anode, and an electron transporting layer (ETL) located between the light-emitting layer and the cathode. Of course, according to needs, in some embodiments, a hole injection layer (HIL) may further be provided between the hole transporting layer HTL and the anode, and an electron injection layer (EIL) may further be provided between the electron transporting layer ETL and the cathode.

For example, the anode may be made of a transparent conductive material with a high work function, and an electrode material of the anode may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), or a carbon nanotube; the cathode may be made of a material with a high conductivity and a low work function, and an electrode material of the cathode may include an alloy such as a magnesium aluminum (MgAl) alloy or a lithium aluminum (LiAl) alloy, or a simple metal such as magnesium (Mg), aluminum (Al), lithium (Li) or silver (Ag). A material of the light-emitting layer may be selected according to different colors of light emitted by the light-emitting layer. For example, the material of the light-emitting layer includes a fluorescent light-emitting material or a phosphorescent light-emitting material. For example, in at least one embodiment of the present disclosure, the light-emitting layer may adopt a doping system. That is, a dopant material is mixed into a host light-emitting material to obtain a usable light-emitting material. For example, the host light-emitting material may be a metal compound material, a derivative of anthracene, an aromatic diamine compound, a triphenylamine compound, an aromatic triamine compound, a derivative of biphenyldiamine, or a triarylamine polymer.

A specific structure of the pixel driving circuit is not limited in the embodiments of the present disclosure, and may be designed according to actual situations. For example, the pixel driving circuit is composed of electronic elements such as switching elements, a driving element, and capacitor(s) (abbreviated as C(s)). The switching elements and the driving element may be thin film transistors (abbreviated as TFTs). For example, the switching elements may be switching transistors, and the driving element may be a driving transistor. For example, the pixel driving circuit may include three thin film transistors (two switching transistors and one driving transistor) and one capacitor, which form a 3T1C structure. Of course, the pixel driving circuit may also include more than three thin film transistors (a plurality of switching transistors and one driving transistor) and at least one capacitor, which form a 7T1C structure, an 8T1C structure or a 9T1C structure.

Control electrodes (which may also be referred to as gates) of the thin film transistors in the pixel driving circuit may be used to receive different signals. For example, referring to FIG. 2, a control electrode of the driving transistor D-TFT in the pixel driving circuit 200 may be used to receive a data signal $V_{DATA}$, or to receive a data signal $V_{DATA}$+Vth after compensation of a threshold voltage of the driving transistor D-TFT, in which Vth is the threshold voltage of the driving transistor D-TFT, $V_{DATA}$ is a voltage signal. According to the received data signal, the driving transistor D-TFT may control an intensity of an electric signal (e.g., a magnitude of a current) flowing through the light-emitting device L, thereby controlling brightness of light emitted by the light-emitting device L.

For another example, the switching elements in the pixel driving circuit are each a switching transistor. The switching transistor may be turned on or off according to a signal received by a control electrode thereof. For example, the control electrode of the switching transistor in the pixel driving circuit may be used to receive a light-emitting control signal or a gate scanning signal, and the switching transistor may be turned on or off according to the received light-emitting control signal or the received gate scanning signal. For example, the switching transistor may be an oxide thin-film transistor. The oxide thin-film transistor is sensitive to positive and negative pressures due to its own characteristics. If the oxide thin-film transistor is subjected to a same pressure for a long time, a threshold voltage of the transistor will be shifted. For example, a pixel driving circuit in the related art includes a single switching transistor for receiving a light-emitting control signal. Since the switching transistor is subjected to a positive pressure for a long time, a threshold voltage thereof is shifted. As a result, brightness of the light-emitting device coupled to the pixel driving circuit may decrease.

In order to avoid this problem, some embodiments of the present disclosure provide a pixel driving circuit 200. Referring to FIG. 2, the pixel driving circuit 200 includes a first switching element T1 and a second switching element T2. For example, the first switching element T1 and the second switching element T2 are configured to receive light-emitting control signals. A control electrode of the first switching element T1 is coupled to a first signal output terminal EM1, and a control electrode of the second switching element is coupled to a second signal output terminal EM2. A first electrode of the first switching element T1 is coupled to a first electrode of the second switching element T2, and a second electrode of the first switching element T1 is coupled to a second electrode of the second switching element T2.

For example, referring to FIG. 2, the first signal output terminal EM1 and the second signal output terminal EM2 may be coupled to a single shift register. Moreover, the first signal output terminal EM1 may output a first light-emitting control signal to the first switching element T1, and the second signal output terminal EM2 may output a second light-emitting control signal to the second switching element T2. The first light-emitting control signal and the second light-emitting control signal may each be a signal with alternate high and low levels. In an example where the transistors in the pixel driving circuit 200 are all N-type transistors that are turned on at high levels and are turned off at low levels, when the first light-emitting control signal is at a high level, the second light-emitting control signal is at a low level, and in this case, the first switching element T1 is turned on, the second switching element T2 is turned off, and the light-emitting device L may emit light; or, when the first light-emitting control signal is at a low level, the second light-emitting control signal is at a high level, and in this case, the first switching element T1 is turned off, the second switching element T2 is turned on, and the light-emitting device L may also emit light; or, when the first light-emitting control signal is at a low level and the second light-emitting control signal is also at a low level, the first switching element T1 and the second switching element T2 are both turned off, and the light-emitting device L does not emit light.

When the first light-emitting control signal is at a high level, the second light-emitting control signal is at a low level. In this case, the first switching element T1 is turned on, the light-emitting device L may normally emit light, and the second switching element T2 is compensated. For example, an output voltage of the first light-emitting control signal is 10 V, and then a voltage input to the control electrode of the first switching element T1 is 10 V. A voltage of the second electrode of the first switching element T1 is a difference between the voltage of the control electrode and a voltage drop of the first switching element T1. For example, the voltage drop of the first switching element T1 is 1 V, and then the voltage of the second electrode of the first switching element T1 is 9 V. In this case, a difference between the voltage of the control electrode and the voltage of the second electrode of the first switching element T1 is 1 V, so that the first switching element T1 is forward biased. The second light-emitting control signal is a low level signal, for example, an output voltage of the second light-emitting control signal is −10 V. The second electrode of the second switching element T2 is coupled to the second electrode of the first switching element T1, and then a voltage of the second electrode of the second switching element T2 is equal to the voltage of the second electrode of the first switching element T1, i.e., 9 V. Therefore, a difference between a voltage of the control electrode and the voltage of the second electrode of the second switching element T2 is −19 V, and in turn, the second switching element T2 is reverse biased.

The first light-emitting control signal is controlled to be a signal with alternate high and low levels, so that the first switching element T1 may be forward biased and reverse biased respectively. When the levels of the signal are consecutively switched, the first switching element T1 may also be switched between the forward bias and the reverse bias, so that positive and negative pressures to which the first switching element T1 is subjected may be offset, thereby avoiding or reducing a phenomenon of a shift of a threshold voltage.

Similarly, it is also possible to achieve a purpose of avoiding or reducing a shift of a threshold voltage of the second switching element T2 in the pixel driving circuit 200 through control over the input of the second light-emitting control signal and compensation for bias of the second switching element T2. Reasons are similar, and will not be repeated.

Figure 3:
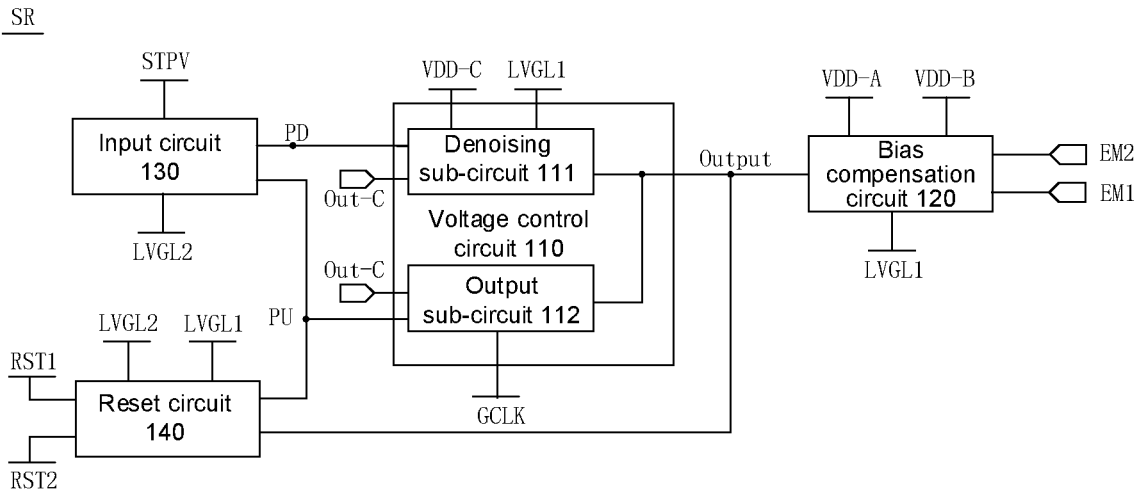
FIG. 3 is a diagram showing a structure of a shift register in a display apparatus, in accordance with some embodiments.

Some embodiments of the present disclosure provide a shift register SR for outputting the first light-emitting control signal and the second light-emitting control signal to the pixel driving circuit 200. As show in FIG. 3, the shift register SR includes a voltage control circuit 110 and a bias compensation circuit 120.

The voltage control circuit 110 is coupled to a first node Output, and the bias compensation circuit 120 is coupled to the first node Output, a first voltage terminal LVGL1, a first signal terminal VDD-A, a second signal terminal VDD-B, a first signal output terminal EM1 and a second signal output terminal EM2.

The first voltage terminal LVGL1 is a direct current (DC) low voltage terminal. For example, a voltage of the first voltage terminal LVGL1 is −15 V, and a signal output from the first voltage terminal LVGL1 may be a low level signal. The first signal terminal VDD-A and the second signal terminal VDD-B are signal receiving terminals, and may receive a first signal and a second signal, respectively. The first signal output terminal EM1 and the second signal output terminal EM2 are signal output terminals of the shift register SR, and are configured to transmit output signals of the shift register SR to another circuit. For example, in a case where the shift register is coupled to the pixel driving circuit, the shift register SR may transmit light-emitting control signals to the pixel driving circuit. For example, referring to FIGS. 2 and 3, the first signal output terminal EM1 and the second signal output terminal EM2 of the shift register SR are respectively coupled to the first switching element T1 and the second switching element T2 of the pixel driving circuit 200, so that the first signal output terminal EM1 and the second signal output terminal EM2 respectively transmit the first light-emitting control signal and the second light-emitting control signal to the first switching element T1 and the second switching element T2, so as to control the first switching element T1 and the second switching element T2 to be turned on or turned off.

The voltage control circuit 110 is configured to control a voltage at the first node Output to be a first voltage or a second voltage. The first voltage and the second voltage are two voltages with different high and low levels. For example, the first voltage is a low voltage, and the second voltage is a high voltage. For example, the first voltage is −15 V, and the second voltage is 10 V.

The bias compensation circuit 120 is configured to: when the voltage at the first node Output is the first voltage, transmit the first signal received by the first signal terminal VDD-A to the first signal output terminal EM1, and transmit the second signal received by the second signal terminal VDD-B to the second signal output terminal EM2; and in response to the voltage at the first node Output being the second voltage, transmit a signal received by the first voltage terminal LVGL1 to the first signal output terminal EM1 and the second signal output terminal EM2.

When the voltage at the first node Output is the first voltage, the first signal is transmitted to the first signal output terminal EM1, and/or, the second signal is transmitted to the second signal output terminal EM2. For example, the first signal and the second signal may each be a signal with alternate high and low levels, and levels of the first signal and the second signal at the same time may be different. For example, the first signal output from the first signal terminal VDD-A and the second signal output from the second signal terminal VDD-B are inverted signals. For example, a difference between a phase of the first signal and a phase of the second signal is 180°. In a case where the first signal is a low level signal, the second signal is a high level signal. In a case where the first signal is a high level signal, the second signal is a low level signal. For example, the first signal and the second signal are not high level signals simultaneously.

For example, in a case where the first signal and the second signal are inverted signals, the light-emitting device L in the pixel driving circuit 200 may emit light normally, and the first switching element T1 and the second switching element T2 may be compensated.

For example, referring to FIG. 2, in the pixel driving circuit 200, when the first signal is at the high level, the first switching element T1 is turned on, so that the light-emitting device L emits light. At this time, since the second signal is the low level signal, a light-emitting control signal of the light-emitting device L is not interfered, and the second switching element T2 may be reverse biased under control of the low level signal. Similarly, when the second signal is at the high level, the first signal is at the low level, and an effect thereof is similar to a condition where the first signal is at the high level and the second signal is at the low level, and will not be repeated.

For example, in a light-emitting period of the light-emitting device L, the first signal terminal VDD-A and the second signal terminal VDD-B may be controlled to output signals with different levels (a high level and a low level). In a next light-emitting period, the levels of the signals output from the first signal terminal VDD-A and the second signal terminal VDD-B are switched. That is, by means of special timing control, the first signal terminal VDD-A and the second signal terminal VDD-B output signals with inverted levels, each of which is a signal with alternate high and low levels.

In this way, on one hand, it is possible to ensure that there is always a high level light-emitting control signal input to the pixel driving circuit 200, so that the light-emitting device L may emit light normally in each light-emitting period; on another hand, it is also possible to compensate the first switching element T1 and the second switching element T2 in the pixel driving circuit 200 at different times, thereby avoiding or reducing influence of the shifts of the threshold voltages. For example, in a frame, the first signal terminal VDD-A outputs a high level signal, and the second signal terminal VDD-B outputs a low level signal, the high level signal is used to turn on the first switching element T1 in the pixel driving circuit 200, so as to make the light-emitting device L emit light normally, and the low level signal compensates the second switching element T2; in a next frame, the first signal terminal VDD-A outputs a low level signal, so that the first switching element T1 is compensated, and the second signal terminal VDD-B outputs a high level signal, so that the second switching element T2 controls the light-emitting device L to emit light normally, and subsequent frames alternate as such. For example, duty ratios of the first signal received at the first signal terminal VDD-A and the second signal received at the second signal terminal VDD-B are approximately the same, so that forward and reverse bias times of the first switching element T1 and the second switching elements T2 are similar, and in turn, the positive and negative pressures to which the first switching element T1 and the second switching element T2 are subjected are completely offset.

When the voltage at the first node Output is the second voltage, the signal received by the first voltage terminal LVGL1 may be transmitted to the first signal output terminal EM1 and the second signal output terminal EM2. For example, when the pixel driving circuit 200 enters a reset period, a compensation period and a data writing period, the voltage of the first node Output is controlled to be the second voltage, so that the first signal output terminal EM1 and the second signal output terminal EM2 receive the signal output from the first voltage terminal LVGL1. For example, the signal received by the first voltage terminal LVGL1 is a low level signal, and the low level signal is transmitted to the first signal output terminal EM1 and the second signal output terminal EM2, so that the first switching element T1 and the second switching element T2 in the pixel driving circuit 200 are both turned off, and in turn, the light-emitting device L does not emit light.

In some embodiments of the present disclosure, when the voltage control circuit 110 outputs the first voltage to the first node Output, for example, the first signal terminal VDD-A may be coupled to the first signal output terminal EM1 through the bias compensation circuit 120, and/or, the second signal terminal VDD-B may be coupled to the second signal output terminal EM2 through the bias compensation circuit 120, so that the first signal received by the first signal terminal VDD-A is transmitted to the first signal output terminal EM1, and the second signal received by the second signal terminal VDD-B is transmitted to the second signal output terminal EM2. When the voltage control circuit 110 outputs the second voltage to the first node Output, for example, the first voltage terminal LVGL1 may be coupled to the first signal output terminal EM1 and the second signal output terminal EM2 through the bias compensation circuit 120, so that the signal received by the first voltage terminal LVGL1 is transmitted to the first signal output terminal EM1 and the second signal output terminal EM2.

Figure 4A:
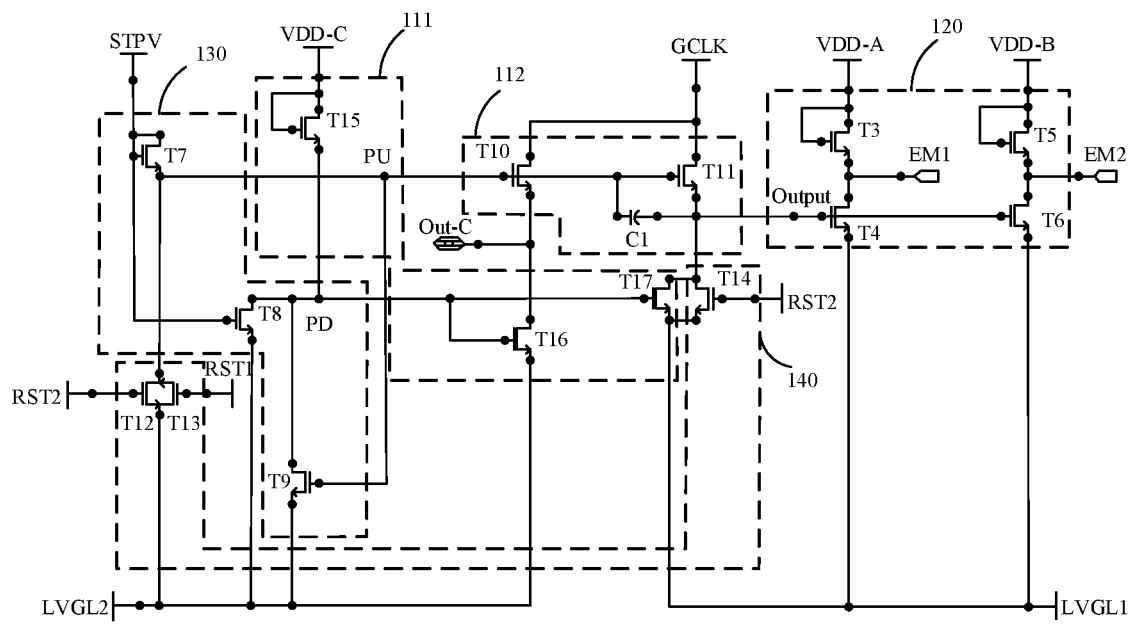
FIG. 4A is a diagram showing a structure of another shift register in a display apparatus, in accordance with some embodiments.

For example, referring to FIG. 4A, the bias compensation circuit 120 includes a third switching element T3, a fourth switching element T4, a fifth switching element T5, and a sixth switching element T6. A control electrode and a first electrode of the third switching element T3 are both coupled to the first signal terminal VDD-A, and a second electrode of the third switching element T3 is coupled to the first signal output terminal EM1. A control electrode of the fourth switching element T4 is coupled to the first node Output, a first electrode of the fourth switching element T4 is coupled to the first signal output terminal EM1, and a second electrode of the fourth switching element T4 is coupled to the first voltage terminal LVGL1. A control electrode and a first electrode of the fifth switching element T5 are both coupled to the second signal terminal VDD-B, and a second electrode of the fifth switching element T5 is coupled to the second signal output terminal EM2. A control electrode of the sixth switching element T6 is coupled to the first node Output, a first electrode of the sixth switching element T6 is coupled to the second signal output terminal EM2, and a second electrode of the sixth switching element T6 is coupled to the first voltage terminal LVGL1.

When the voltage control circuit 110 outputs the first voltage to the first node Output, the fourth switching element T4 and the sixth switching element T6 are turned off due to action of the first voltage, and the signal received by the first voltage terminal LVGL1 cannot be transmitted to the first signal output terminal EM1 and the second signal output terminal EM2. The third switching element T3 is turned on due to action of the first signal, so that the first signal terminal VDD-A is coupled to the first signal output terminal EM1. As a result, the first signal output from the first signal terminal VDD-A is transmitted to the first signal output terminal EM1 through the third switching element T3, and the first signal output terminal EM1 may receive the first signal. Alternatively, the fifth switching element T5 is turned on due to action of the second signal, so that the second signal terminal VDD-B is coupled to the second signal output terminal EM2. As a result, the second signal output from the second signal terminal VDD-B is transmitted to the second signal output terminal EM2 through the fifth switching element T5, and the second signal output terminal EM2 may receive the second signal.

When the voltage control circuit 110 outputs the second voltage to the first node Output, the fourth switching element T4, the sixth switching element T6, and one of the third switching element T3 and the fifth switching element T5 are turned on. Moreover, sizes of the fourth switching element T4 and the sixth switching element T6 are larger than sizes of the third switching element T3 and the fifth switching element T5, for example, a width-to-length ratio of the fourth switching element T4 is three times that of the third switching element T3, and a width-to-length ratio of the sixth switching element T6 is three times that of the fifth switching element T5. Therefore, the signals output from the first signal output terminal EM1 and the second signal output terminal EM2 are the signal received by the first voltage terminal LVGL1.

Figure 4B:
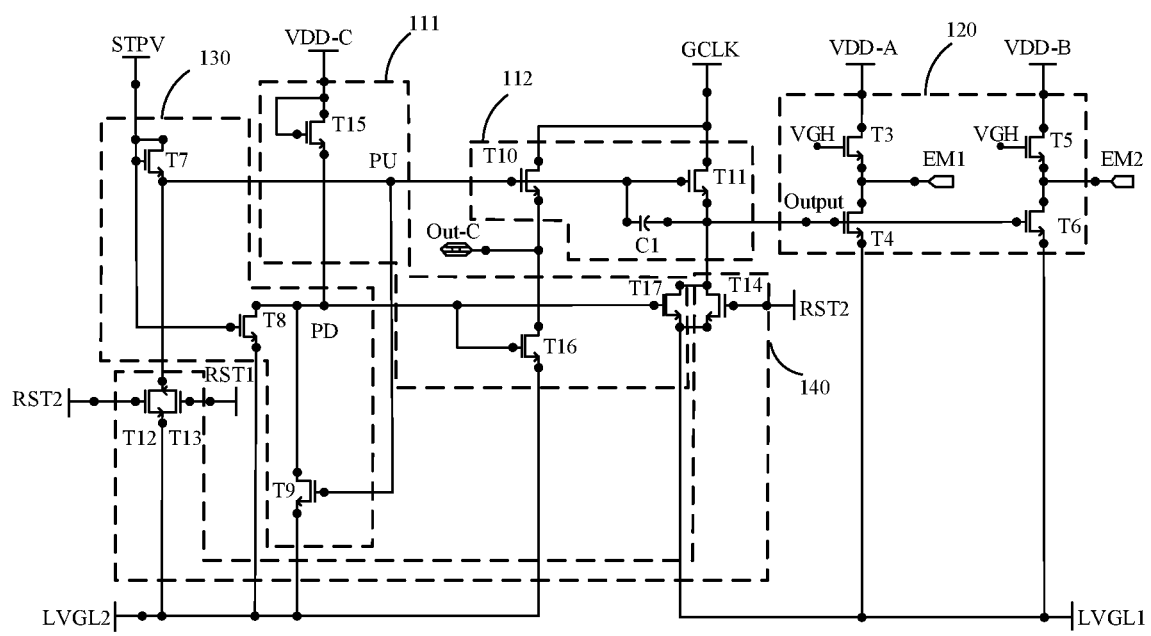
FIG. 4B is a diagram showing a structure of yet another shift register in a display apparatus, in accordance with some embodiments.

For another example, referring to FIG. 4B, the control electrode of the third switching element T3 and the control electrode of the fifth switching element T5 may also be coupled to a third voltage terminal (e.g., a high level terminal VGH), so that the third switching element T3 and the fifth switching element T5 always remain in turn-on states. When the voltage control circuit 110 outputs the first voltage to the first node Output, the signals output from the first signal terminal VDD-A and the second signal terminal VDD-B may directly reach the first signal output terminal EM1 and the second signal output terminal EM2, respectively. When the voltage control circuit 110 outputs the second voltage to the first node Output, by setting the sizes of the fourth switching element T4 and the sixth switching element T6 as described above, the signal received by the first voltage terminal LVGL1 may also be transmitted to the first signal output terminal EM1 and the second signal output terminal EM2 without being affected.

In some embodiments, the voltage control circuit 110 of the shift register SR includes an output sub-circuit 112 and a denoising sub-circuit 111.

The output sub-circuit 112 is coupled to a clock signal terminal GCLK, a second node PU, and the first node Output, and is configured to transmit a clock signal received by the clock signal terminal GCLK to the first node Output in response to a voltage at the second node PU, so that the voltage at the first node Output is the first voltage or the second voltage.

For example, in a case where the voltage at the second node PU has a certain value, the output sub-circuit 112 may couple the clock signal terminal GCLK to the first node Output, so as to transmit the clock signal received by the clock signal terminal GCLK to the first node Output. In a case where a signal transmitted by the clock signal terminal to the first node Output is at a high level, the voltage of the first node Output is configured to be the second voltage. In a case where the signal transmitted by the clock signal terminal to the first node Output is at a low level, the voltage of the first node Output is configured to be the first voltage.

For example, referring to FIG. 4A, the output sub-circuit 112 includes an eleventh switching element T11. A control electrode of the eleventh switching element T11 is coupled to the second node PU, a first electrode of the eleventh switching element T11 is coupled to the clock signal terminal GCLK, and a second electrode of the eleventh switching element T11 is coupled to the first node Output. In a case where the voltage at the second node PU has a value greater than the certain value (e.g., 1 V), for example, in a case where the voltage at the second node PU is 10 V, the voltage at the second node PU may make the eleventh switching element T11 turned on, so that the clock signal terminal GCLK is coupled to the first node Output, and the clock signal received by the clock signal terminal GCLK is transmitted to the first node Output through the eleventh switching element T11.

In some embodiments, the output sub-circuit 112 is further configured to raise or lower the voltage at the second node PU in response to the voltage at the first node Output being the second voltage.

For example, the output sub-circuit 112 further includes an energy storage element C1. A first electrode plate of the energy storage element C1 is coupled to the first node Output, and a second electrode plate of the energy storage element C1 is coupled to the second node PU. The energy storage element C1 may change a voltage at a node coupled thereto through a "bootstrap" action. For example, referring to FIG. 4A, in a period, a voltage on the first electrode plate of the energy storage element C1 is the first voltage, and a voltage on the second electrode plate of the energy storage element C1 is the second voltage. In a next period, the voltage on the first electrode plate coupled to the first node Output is raised to the second voltage. Since relative voltages of both electrode plates of the energy storage element C1 do not change, the voltage on the second electrode plate may be raised to a voltage higher than the second voltage, so that the voltage at the second node PU coupled to the second electrode plate is further raised accordingly.

In some embodiments, the output sub-circuit 112 is further coupled to a third signal output terminal Out-C, and is further configured to transmit the clock signal received by the clock signal terminal GCLK to the third signal output terminal Out-C in response to the voltage at the second node PU.

For example, when the voltage at the second node PU is the second voltage, the output sub-circuit 112 may couple the clock signal terminal GCLK to the third signal output terminal Out-C, so as to transmit the clock signal received by the clock signal terminal GCLK to the third signal output terminal Out-C.

For example, referring to FIG. 4A, the output sub-circuit 112 further includes a tenth switching element T10. A control electrode of the tenth switching element T10 is coupled to the second node PU, a first electrode of the tenth switching element T10 is coupled to the clock signal terminal GCLK, and a second electrode of the tenth switching element T10 is coupled to the third signal output terminal Out-C. When the voltage of the second node PU is the second voltage, the tenth switching element T10 is turned on, so that the clock signal terminal GCLK is coupled to the third signal output terminal Out-C, and the clock signal received by the clock signal terminal GCLK is transmitted to the third signal output terminal Out-C through the tenth switching element T10.

The denoising sub-circuit 111 is coupled to the first voltage terminal LVGL1, the first node Output, and a third node PD, and is configured to control the voltage at the first node Output to be the first voltage in response to a voltage at the third node PD.

For example, when the voltage at the third node PD is the second voltage, the denoising sub-circuit 111 may couple the first voltage terminal LVGL1 to the first node Output, so that a signal received by the first voltage terminal LVGL1 is transmitted to the first node Output, and the voltage at the first node Output is configured to be the first voltage.

For example, referring to FIG. 4A, the denoising sub-circuit 111 includes a seventeenth switching element T17. A control electrode of the seventeenth switching element T17 is coupled to the third node PD, a first electrode of the seventeenth switching element T17 is coupled to the first node Output, and a second electrode of the seventeenth switching element T17 is coupled to the first voltage terminal LVGL1. When the voltage at the third node PD is the second voltage, the seventeenth switching element T17 is turned on, and the first voltage terminal LVGL1 is coupled to the first node Output, so that the signal received by the first voltage terminal LVGL1 is transmitted to the first node Output through the seventeenth switching element T17, and the voltage at the first node Output is configured to be the first voltage.

In some embodiments, the denoising sub-circuit 111 is further coupled to a third signal terminal VDD-C, and is further configured to transmit a third signal received by the third signal terminal VDD-C to the third node PD.

For example, the denoising sub-circuit 111 may couple the third signal terminal VDD-C to the third node PD, so as to transmit the third signal received by the third signal terminal VDD-C to the third node PD. The third signal received by the third signal terminal VDD-C may also be a level signal. For example, the third signal received by the third signal terminal VDD-C is a continuous high level signal.

For example, referring to FIG. 4A, the denoising sub-circuit further includes a fifteenth switching element T15. A control electrode and a first electrode of the fifteenth switching element T15 are both coupled to the third signal terminal VDD-C, and a second electrode of the fifteenth switching element T15 is coupled to the third node PD. When the third signal terminal VDD-C receives a high level signal, the high level signal may make the fifteenth switching element T15 turned on, so that the third signal terminal VDD-C is coupled to the third node PD, and the high level signal received by the third signal terminal VDD-C is transmitted to the third node PD through the fifteenth switching element T15.

In some embodiments, the denoising sub-circuit 111 is further coupled to a second voltage terminal LVGL2 and the third signal output terminal Out-C, and is further configured to transmit a signal received by the second voltage terminal LVGL2 to the third signal output terminal Out-C in response to the voltage at the third node PD.

The second voltage terminal LVGL2 is a DC low voltage terminal. For example, a voltage of the second voltage terminal LVGL2 is equal to the voltage of the first voltage terminal LVGL1. For example, the second voltage terminal LVGL2 is coupled to the first voltage terminal LVGL1, and a signal output from the second voltage terminal LVGL2 may be a low level signal.

For example, when the voltage at the third node PD is the second voltage, the denoising sub-circuit 111 may couple the second voltage terminal LVGL2 to the third signal output terminal Out-C, so as to transmit the signal received by the second voltage terminal LVGL2 to the third signal output terminal Out-C.

For example, the denoising sub-circuit 111 further includes a sixteenth switching element T16. A control electrode of the sixteenth switching element T16 is coupled to the third node PD, a first electrode of the sixteenth switching element is coupled to the third signal output terminal Out-C, and a second electrode of the sixteenth switching element T16 is coupled to the second voltage terminal LVGL2. When the voltage at the third node PD is the second voltage, the sixteenth switching element T16 is turned on under control of the second voltage, and the second voltage terminal LVGL2 is coupled to the third signal output terminal Out-C, so that the signal received by the second voltage terminal LVGL2 is transmitted to the third signal output terminal Out-C.

In some embodiments, referring to FIGS. 4A and 4B, the shift register further includes an input circuit 130. The input circuit 130 is coupled to a signal input terminal STPV, the second node PU, the third node PD, and the second voltage terminal LVGL2, and is configured to control the voltage at the second node PU and the voltage at the third node PD in response to an input signal received by the signal input terminal STPV.

The input circuit 130 may control the voltage at the second node PU and the voltage at the third node PD, so that level signals of the second node PU and the third node PD are inverted signals. For example, when the voltage at the second node PU is the second voltage, the signal of the second node PU is a high level signal. In a case, the voltage at the third node PD is the first voltage, and the signal of the third node PD is a low level signal. For another example, when the voltage at the second node PU is the first voltage, the signal of the second node PU is a low level signal. In a case, the voltage at the third node PD is the second voltage, and the signal of the third node PD is a high level signal.

The signal input terminal STPV may be used as an initial signal input terminal of the shift register SR. For example, when the signal input terminal STPV inputs a first-period high level signal, the voltage at the second node PU may be set high, for example, the voltage at the second node PU is the second voltage, and the voltage at the third node PD may be set low, for example, the voltage at the third node PD is the first voltage.

For example, referring to FIG. 4A, the input circuit 130 includes a seventh switching element T7 and a ninth switching element T9. A control electrode and a first electrode of the seventh switching element T7 are both coupled to the signal input terminal STPV, and a second electrode of the seventh switching element T7 is coupled to the second voltage terminal LVGL2. A control electrode of the ninth switching element T9 is coupled to the second node PU, a first electrode of the ninth switching element T9 is coupled to the third node PD, and a second electrode of the ninth switching element is coupled to the second voltage terminal LVGL2. When the signal input terminal STPV inputs the first-period high level signal, for example, when an output voltage of the first-period high level signal is the second voltage, the seventh switching element T7 is turned on due to action of the high level, and the signal input terminal STPV is coupled to the second node PU, so that the high level signal input from the signal input terminal STPV is transmitted to the second node PU, and in turn, the voltage at the second node PU is set high, for example, the voltage at the second node PU is configured to be the second voltage. When the voltage at the second node PU is the second voltage, the ninth switching element T9 is turned on, and the second voltage terminal LVGL2 is coupled to the third node PD. Since a size of the ninth switching element T9 is larger than that of the fifteenth switching element T15, the signal received by the second voltage terminal LVGL2 may be transmitted to the third node PD, and the voltage at the third node PD may be set low, for example, the voltage at the third node PD is configured to be the first voltage.

In some embodiments, the input circuit 130 further includes an eighth switching element T8. A control electrode of the eighth switching element T8 is coupled to the signal input terminal STPV, a first electrode of the eighth switching element T8 is coupled to the third node PD, and a second electrode of the eighth switching element T8 is coupled to the second voltage terminal LVGL2. When the signal input terminal STPV inputs the first-period high level signal, the eighth switching element T8 is turned on due to the action of the high level, and the second voltage terminal LVGL2 is coupled to the third node PD, so that the signal received by the second voltage terminal LVGL2 is transmitted to the third node PD, and the voltage at the third node PD is configured to be the first voltage. The control electrode of the eighth switching element T8 is directly coupled to the signal input terminal STPV. Compared to the ninth switching element T9, the turning on and turning off of the ninth switching element T9 are directly controlled by the second node PU, so that the input signal of the signal input terminal STPV first reaches the second node PU, and then reaches the control electrode of the ninth switching element T9 through the second node PU, the eighth switching element T8 is more directly controlled by the input signal. In a case where the eighth switching element T8 and the ninth switching element T9 act together, reliability of the shift register SR in controlling the voltages at the second node PU and the third node PD may increase while efficiency is improved.

In some embodiments, referring to FIGS. 4A and 4B, the shift register SR further includes a reset circuit 140. The reset circuit 140 is coupled to a first reset signal terminal RST1, the second node PU and the second voltage terminal LVGL2, and is configured to transmit the signal received by the second voltage terminal LVGL2 to the second node PU in response to a first reset signal received by the first reset signal terminal RST1.

For example, when the first reset signal input from the first reset signal terminal RST1 is a high level signal, the reset circuit 140 may couple the second voltage terminal LVGL2 to the second node PU, so that the signal received by the second voltage terminal LVGL2 is transmitted to the second node PU, for example, the signal configures the voltage at the second node PU to be the first voltage.

For example, the reset circuit 140 includes a thirteenth switching element T13. A control electrode of the thirteenth switching element T13 is coupled to the first reset signal terminal RST1, a first electrode of the thirteenth switching element T13 is coupled to the second voltage terminal LVGL2, and a second electrode of the thirteenth switching element is coupled to the second node PU. When the first reset signal input from the first reset signal terminal RST1 is the high level signal, the high level signal makes the thirteenth switching element T13 turned on, and the second voltage terminal LVGL2 is coupled to the second node PU, so that the signal received by the second voltage terminal LVGL2 is transmitted to the second node PU through the thirteenth switching element T13.

In some embodiments, referring to FIGS. 4A and 4B, the reset circuit 140 is further coupled to a second reset signal terminal RST2 and the first voltage terminal LVGL1, and the reset circuit 140 is further configured to: transmit the signal received by the second voltage terminal LVGL2 to the second node PU in response to a second reset signal received by the second reset signal terminal RST2; and transmit a signal received by the first voltage terminal LVGL1 to the first node Output in response to the second reset signal received by the second reset signal terminal RST2, so that the voltage at the first node Output is the first voltage.

For example, when the second reset signal output from the second reset signal terminal RST2 is a high level signal, the reset circuit 140 may couple the second voltage terminal LVGL2 to the second node PU, so that the signal received by the second voltage terminal LVGL2 is transmitted to the second node PU, and the reset circuit 140 may couple the first voltage terminal LVGL1 to the first node Output, so that the signal received by the first voltage terminal LVGL1 is transmitted to the first node Output, and the voltage at the first node Output is configured to be the first voltage due to action of the signal.

For example, the reset circuit 140 further includes a twelfth switching element T12 and a fourteenth switching element T14. A control electrode of the twelfth switching element T12 is coupled to the second reset signal terminal RST2, a first electrode of the twelfth switching element T12 is coupled to the second node PU, and a second electrode of the twelfth switching element T12 is coupled to the second voltage terminal LVGL2. A control electrode of the fourteenth switching element T14 is coupled to the second reset signal terminal RST2, a first electrode of the fourteenth switching element T14 is coupled to the first node Output, and a second electrode of the fourteenth switching element T14 is coupled to the first voltage terminal LVGL1. When the second reset signal output from the second reset signal terminal RST2 is the high level signal, the high level signal makes the twelfth switching element T12 and the fourteenth switching element T14 turned on, and the second voltage terminal LVGL2 is coupled to the second node PU, and the first voltage terminal LVGL1 is coupled to the first node Output, so that the signal received by the second voltage terminal LVGL2 is transmitted to the second node PU, and the signal received by the first voltage terminal LVGL1 is transmitted to the first node Output.

In the light-emitting control driving circuit 100, the plurality of shift registers SR(1) to SR(n) are usually cascaded in sequence. For example, in a case where the plurality of shift registers are cascaded in sequence, each shift register SR is in signal interaction with an adjacent shift register thereof.

Figure 5:
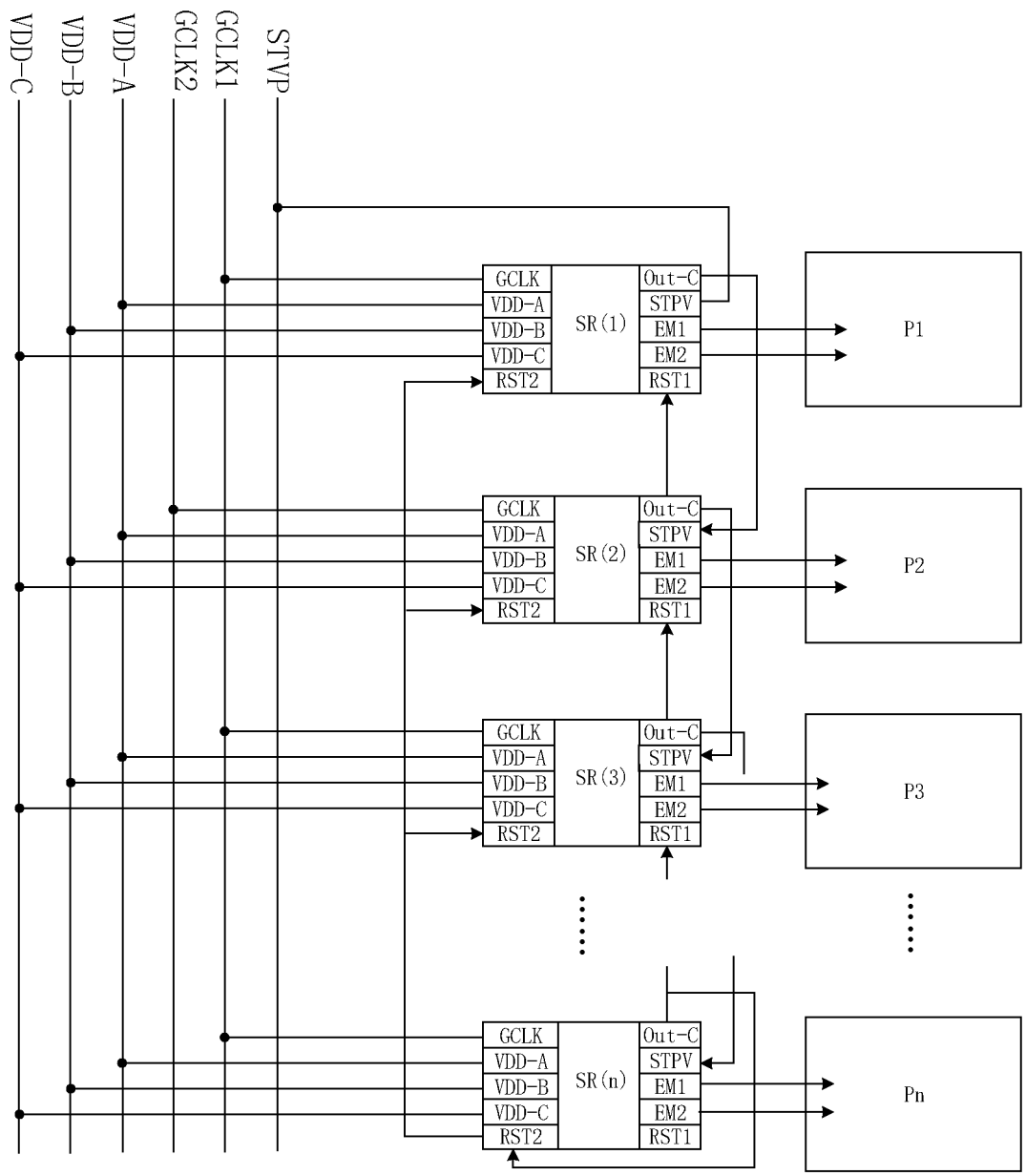
FIG. 5 is a diagram showing a cascade relationship of a shift register in a display apparatus, in accordance with some embodiments.
Figure 6:
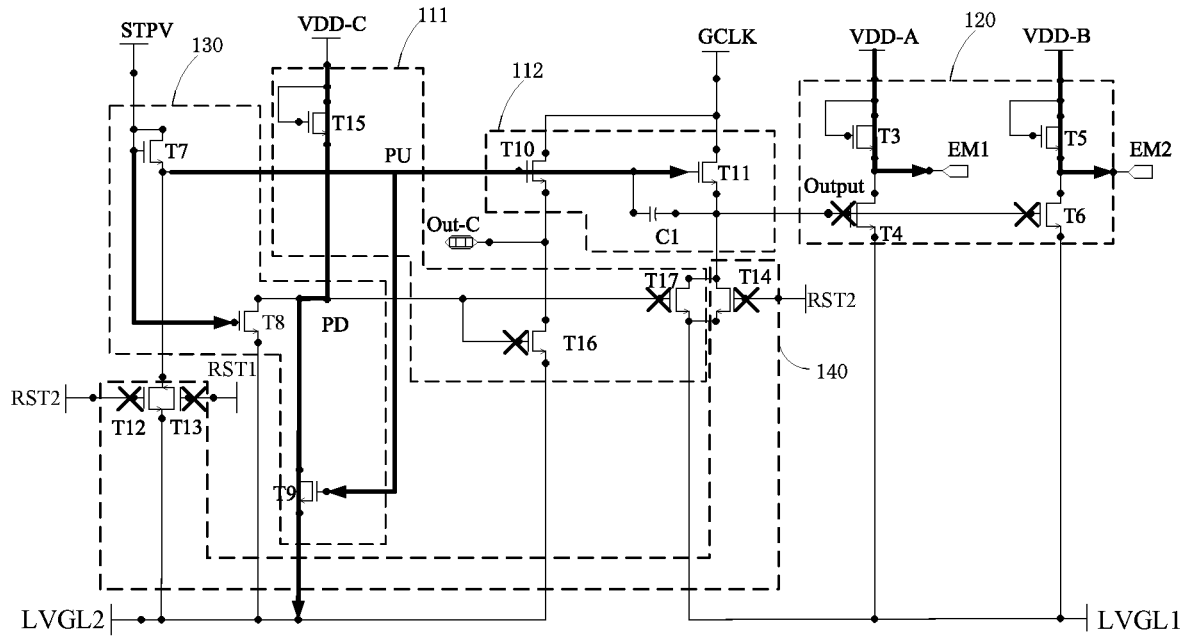
FIG. 6 is a diagram showing directions of signal flows of a shift register in a display apparatus in an initial period, in accordance with some embodiments.

For example, FIG. 5 is a diagram showing a cascade relationship of the shift registers SR(1) to SR(n), in accordance with some embodiments of the present disclosure. For example, a first-stage shift register SR (1) provides a first light-emitting control signal and a second light-emitting control signal respectively to control electrodes of a first switching element T1 and a second switching element T2 that are in a first row of sub-pixels and coupled to the first-stage shift register SR (1). A third signal output terminal Out-C of the first-stage shift register SR(1) is coupled to a signal input terminal STPV of a second-stage shift register SR(2). That is, a signal output from the third signal output terminal Out-C of the first-stage shift register SR(1) is used as an input signal of the second-stage shift register SR(2). The second-stage shift register SR(2) is adjacent to the first-stage shift register SR(1). The second-stage shift register SR(2) provides a first light-emitting control signal and a second light-emitting control signal respectively to control electrodes of a first switching element T1 and a second switching element T2 that are in a second row of sub-pixels and coupled to the second-stage shift register SR (2). A third signal output terminal Out-C of the second-stage shift register SR(2) is coupled to a signal input terminal STPV of a third-stage shift register SR(3). That is, a signal output from the third signal output terminal Out-C of the second-stage shift register SR(2) is used as an input signal of the third-stage shift register SR(3). The third-stage shift register SR(3) is adjacent to the second-stage shift register SR(2). In addition, a cascade manner of remaining shift registers is the same as the above manner.

In addition, while outputting the signal, the third signal output terminal Out-C of the second-stage shift register SR(2) also provides the output signal to a first reset signal terminal RST1 of the first-stage shift register SR(1) as a first reset signal of the first reset signal terminal RST1 of the first-stage shift register SR(1), so that a reset circuit 140 in the first-stage shift register SR(1) is configured to transmit a signal received by the second voltage terminal LVGL2 to a second node PU in response to the first reset signal received by the first reset signal terminal RST1. While outputting a signal, a third signal output terminal Out-C of the third-stage shift register SR(3) also provides the output signal to a first reset signal terminal RST1 of the second-stage shift register SR(2) as a first reset signal of the first reset signal terminal RST1 of the second-stage shift register SR(2), so that a reset circuit 140 in the second-stage shift register SR(2) is configured to transmit the signal received by the second voltage terminal LVGL2 to a second node PU in response to the first reset signal received by the first reset signal terminal RST1. In this way, the plurality of shift registers SR(1) to SR(n-1) that are cascaded may be reset sequentially.

Since there is no shift register in a next stage to input a first reset signal to the shift register SR(n), a second reset signal terminal RST2 of the shift register SR(n) may be directly coupled to a reset signal line, so as to reset an n-th row of sub-pixels. Moreover, the second reset signal terminal RST2 of the shift register SR(n) is also sequentially coupled to second reset signal terminals RST2 of the shift registers SR(1) to SR(n−1), so as to provide an overall reset signal for the present frame.

It will be noted that, circuits in the shift registers SR(1) to SR(n), such as voltage control circuits 110 and bias compensation circuits 120, have same structures and functions as the corresponding circuits in the above shift register SR, and details will not be repeated herein.

With regard to the light-emitting control driving circuit 100, FIG. 1 is merely an example, in which single-side driving (i.e., a light-emitting control driving circuit is disposed in a single area of the peripheral area in the display panel, and driven is performed row by row from a single side) is adopted for description. In some other embodiments, double-side simultaneous driving (i.e., light-emitting control driving circuits are disposed in both areas of the peripheral area in the display panel in an extending direction of the signal lines for transmitting the light-emitting control signals, and driven is performed row by row from both sides simultaneously through the two light-emitting control driving circuits) may be adopted. In yet some other embodiments, the display panel may adopt double-side alternate driving (i.e., light-emitting control driving circuits are disposed in both areas of the peripheral area in the display panel in the extending direction of the signal lines for transmitting the light-emitting control signals, and driven is performed row by row from both sides alternately through the two light-emitting control driving circuits). The embodiments of the present disclosure are described by considering the single-side driving as an example.

For example, clock signal terminals of any two adjacent cascaded shift registers are respectively coupled to a first clock signal line and a second clock signal line that are different. For example, as shown in FIG. 5, a clock signal terminal GCLK of a shift register in an odd-numbered stage is coupled to a first clock signal line GCLK1, and a clock signal terminal GCLK of a shift register in an even-numbered stage is coupled to a second clock signal line GCLK2.

Some embodiments of the present disclosure provide a driving method for the shift register SR. The shift register is coupled to the first node Output, the first signal terminal VDD-A, the second signal terminal VDD-B, the first signal output terminal EM1, the second signal output terminal EM2 and the first voltage terminal LVGL1.

The driving method for the shift register includes:
first, controlling a voltage at the first node Output to be a first voltage or a second voltage;
second, when the voltage at the first node Output is the first voltage, transmitting a first signal received by the first signal terminal VDD-A to the first signal output terminal EM1, and transmitting a second signal received by the second signal terminal VDD-B to the second signal output terminal EM2;
then, in response to the voltage at the first node Output being the second voltage, transmitting a signal received by the first voltage terminal LVGL1 to the first signal output terminal EM1 and the second signal output terminal EM2.

The first signal and the second signal are both rectangular wave signals, and levels of the first signal and the second signal are opposite.

In some embodiments, the first signal and the second signal are both square wave signals. A square wave signal means that a duty ratio of the signal is close to 50%.

In the following, a process of driving the shift register SR by using the driving method for the shift register SR provided by some embodiments of the present disclosure will be described in detail. The driving process may include the following four periods: an initial period, a data writing period, a denoising period, and a reset period.

For example, a description will be given by considering an example in which all switching elements are N-type elements, and the first switching element T1 works, and the second switching element T2 performs threshold voltage compensation. FIGS. 6 to 9 are schematic diagrams showing signal flows in the initial period, the data writing period, the denoising period, and the reset period, respectively. Directions indicated by arrows of the black lines are directions of the signal flows, and "X" in the figures indicates that a switching element is in a turn-off state. FIG. 10 is a timing diagram of a driving method for a driving circuit (circuits in a single shift register). The driving circuit in the embodiments of the present disclosure will be described by considering a first stage of shift register as an example. STPV represents a timing of a level of a signal input terminal, GCLK1 and GCLK2 respectively represent timings of levels of clock signal terminals of a shift register in an odd-numbered stage and a shift register in an even-numbered stage, VDD-A represents a timing of a level of the first signal terminal, VDD-B represents a timing of a level of the second signal terminal, EM1 represents a timing of a level received by the first signal output terminal, and EM2 represents a timing of a level received by the second signal output terminal, i.e., timings of levels output from the first signal output terminal and the second signal output terminal, and PU represents a timing of a level of a second node.

Referring to FIG. 4A, in conjunction with a second frame shown in FIG. 10, in the initial period, the first signal terminal VDD-A outputs a second level (corresponding to a high level VGH), and the bias compensation circuit 120 couples the first signal terminal VDD-A to the first signal output terminal EM1, so that the second level is transmitted to the first signal output terminal EM1 of the bias compensation circuit 120; the second signal terminal VDD-B outputs a first level (corresponding to a low level VGL), and the bias compensation circuit 120 can not couple the second signal terminal VDD-B to the second signal output terminal EM2.

The signal input terminal STPV of the input circuit 130 in the shift register SR receives the second level, the seventh switching element T7 and the eighth switching element T8 are turned on, and the input circuit 130 transmits the second level to the second node PU of the shift register SR, and a voltage at the second node PU is configured to be the second voltage. At this time, the tenth switching element T10 and the eleventh switching element T11 are turned on, and the energy storage element C1 is charged. Since the clock signal terminal GCLK inputs the first level in the initial period, the first electrode plate of the energy storage element C1 may be charged to the first voltage. The second electrode plate of the energy storage element C1 is coupled to the second node PU, so that the second electrode plate may be charged to the second voltage. Moreover, in order to avoid affecting the data writing period due to that a sixteenth switching element T16 and a seventeenth switching element T17 are turned on, a voltage at a third node PD needs to be reduced. Therefore, the input circuit 130 is further provided with the ninth switching element T9 therein. The ninth switching element T9 is turned on due to action of the second voltage at the second node PU, a first electrode of the ninth switching element T9 is coupled to the third node PD, and a second electrode of the ninth switching element T9 is coupled to a second voltage terminal LVGL2, so that the voltage at the third node PD may be pulled down. The sixteenth switching element T16 and the seventeenth switching element T17 are in a turn-off state. In this period, the twelfth switching element T12, the thirteenth switching element T13, the fourteenth switching element T14, the sixteenth switching element T16, and the seventeenth switching element T17 are all in a turn-off state, and the fourth switching element T4 and the sixth switching element T6 are not turned on. Moreover, throughout a bias compensation period, a control electrode of the fifteenth switching element T15 may always receive a second level of the third signal terminal VDD-C, and the fifteenth switching element T15 may always be in a turn-on state, so that signal control is simple. Other switching elements of the denoising sub-circuit 111 are correspondingly turned on in various periods, so as to facilitate subsequent denoising of the second node PU by the third node PD.

Figure 7:
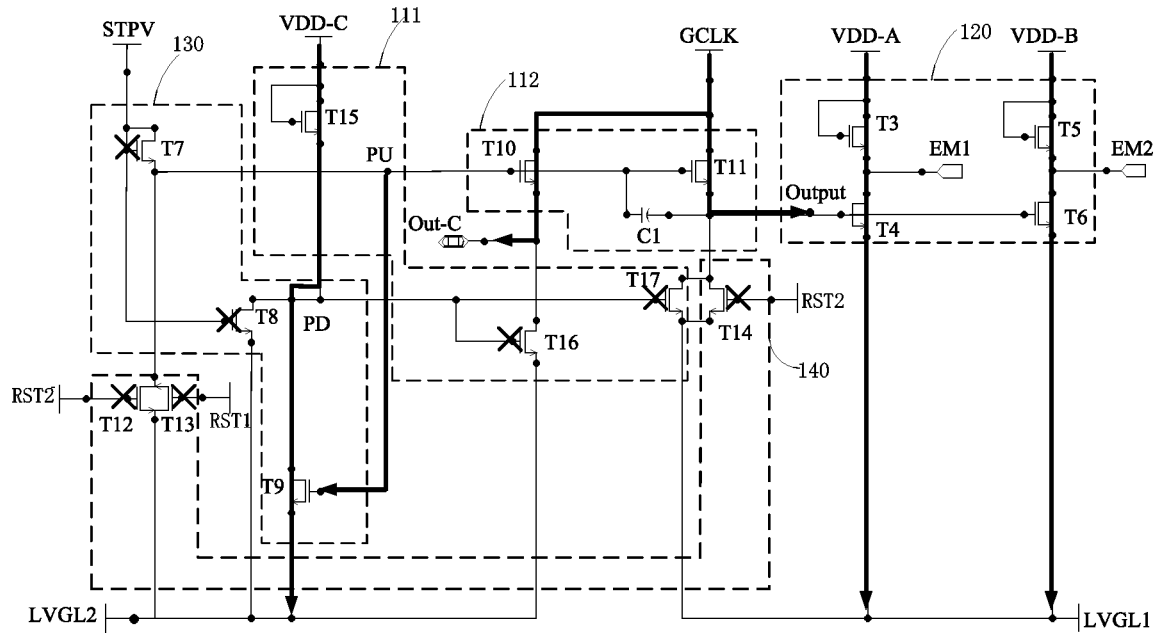
FIG. 7 is a diagram showing directions of signal flows of a shift register in a display apparatus in a data writing period, in accordance with some embodiments.

Referring to FIG. 7, in combination with the second frame shown in FIG. 10, in the data writing period, the signal input terminal STPV of the input circuit 130 receives the first level (the low level VGL), the seventh switching element T7 and the eighth switching element are turned off, and the twelfth switching element T12, the thirteenth switching element T13, the fourteenth switching element T14, the sixteenth switching element T16, and the seventeenth switching element T17 all remain in the turn-off state. The clock signal terminal GCLK outputs a second level in the data writing period. At this time, the voltage at the second node PU is continuously raised through a "bootstrap" action of the energy storage element C1. For example, the voltage at the second node PU is greater than the second voltage (e.g., the voltage at the second node PU is 20 V). The voltage at the second node PU may furthermake the tenth switching element T10 and the eleventh switching element T11 turned on, so that the third signal output terminal Out-C outputs the second level. At this time, the second level output from the third signal output terminal Out-C is used as a first reset signal of a first reset signal terminal RST1 of a reset circuit 140 in a shift register SR in a previous stage and an initial level of a signal input terminal STPV of an input circuit 130 in a shift register SR in a next stage. Referring to the timing diagram of the circuit driving method shown in FIG. 10, the clock signal terminal GCLK in each stage of shift register sequentially input alternate bi-level signals, and when a level GCLK1 of a clock signal of a first stage of shift register is a high level, a level GCLK2 of a clock signal of a second stage of shift register is a low level. In the data writing period, the eleventh switching element T11 is turned on to transmit the second level of the clock signal terminal GCLK to the first node Output, so that the fourth switching element T4 and the sixth switching element T6 are turned on. The bias compensation circuit 120 couples the first voltage terminal LVGL1 to the first signal output terminal EM1 and the second signal output terminal EM2, so that the first signal output terminal EM1 and the second signal output terminal EM2 output a first level, and it is possible to facilitate the pixel driving circuit where the first switching element T1 and the second switching element T2 are located to perform reset, compensation, and data signal writing periods. The reset, compensation, and data signal writing periods of the pixel driving circuit are all completed in the data writing period of the driving method for the shift register provided by some embodiments of the present disclosure.

Figure 8:
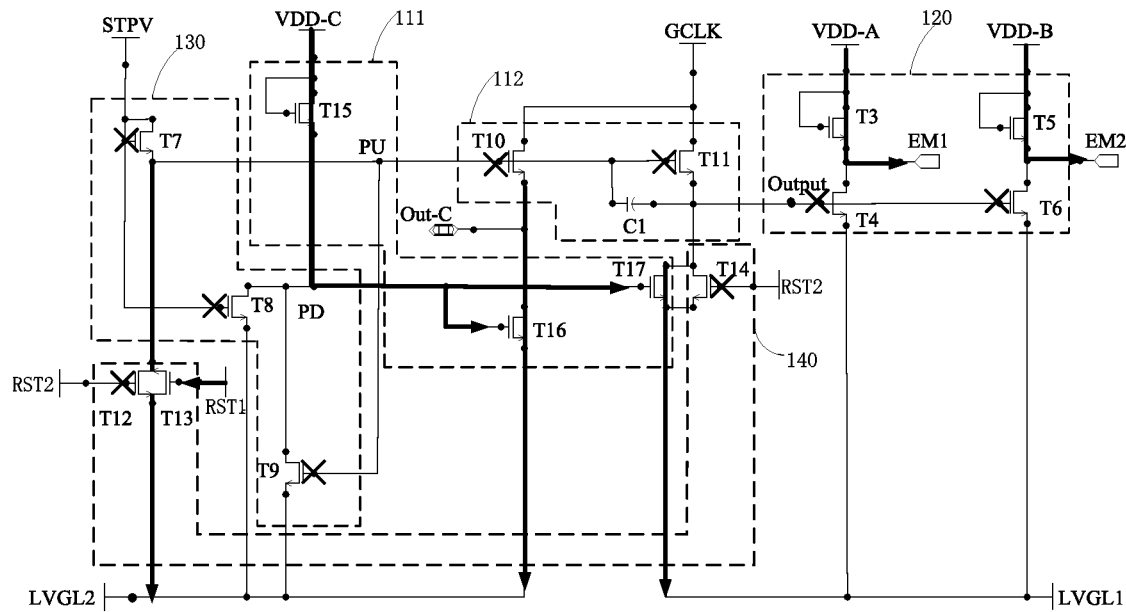
FIG. 8 is a diagram showing directions of signal flows of a shift register in a display apparatus in a denoising period, in accordance with some embodiments.

After the data writing period is completed, the denoising period is started. As shown in FIG. 8, in combination with the second frame shown in FIG. 10, in the denoising period, the first reset signal terminal RST1 of the shift register in a current stage receives a first reset signal input by the shift register in the next stage, and the first reset signal is a second level signal output from the third signal output terminal Out-C of the shift register in the next stage, so that the thirteenth switching element T13 is turned on to couple the second voltage terminal LVGL2 to the second node PU, so as to pull down the voltage at the second node PU to the first voltage. In addition, the second level output from the third signal terminal VDD-C makes the fifteenth switching element T15 turned on, and the denoising sub-circuit 111 transmits the second level output from the third signal terminal VDD-C to the third node PD. The sixteenth switching element T16 and the seventeenth switching element T17 are turned on, so that the second voltage terminal LVGL2 is coupled to the third signal output terminal Out-C, and the first voltage terminal LVGL1 is coupled to the first node Output. As a result, the level of the third signal output terminal Out-C is pulled down, and the voltage at the first node Output is configured to be the first voltage, so as to perform denoising. In this period, the seventh switching element T7, the eighth switching element T8, the twelfth switching element T12, and the fourteenth switching element T14 remain turned off, the tenth switching element T10, the eleventh switching element T11, and the ninth switching element T9 are turned off, and the fourth switching element T4 and the sixth switching element T6 are also turned off.

Figure 9:
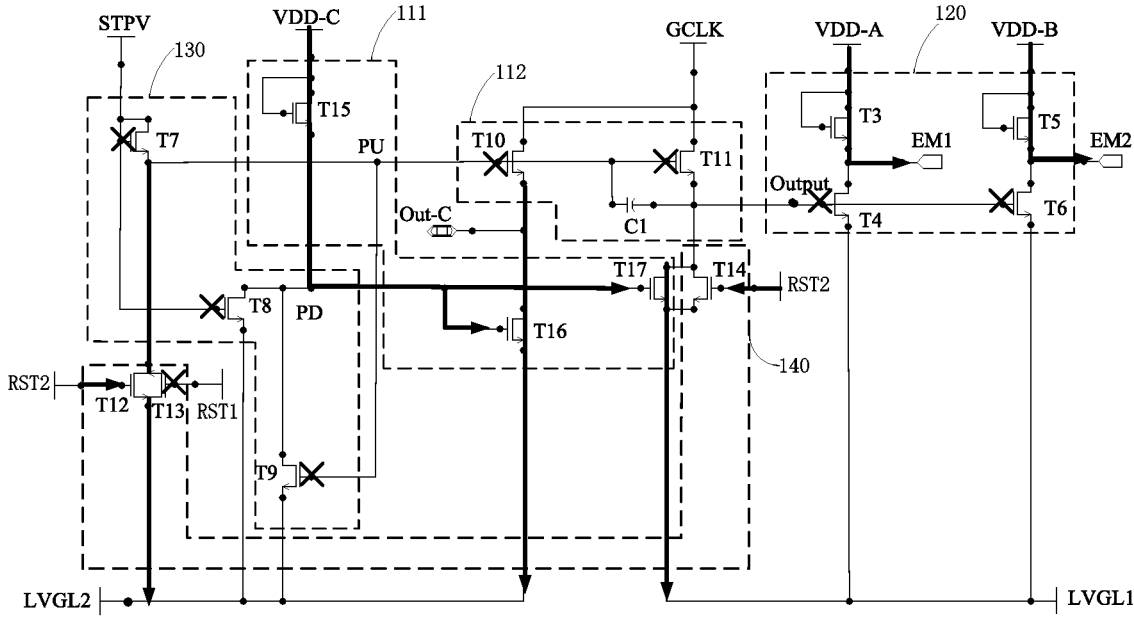
FIG. 9 is a diagram showing directions of signal flows of a shift register in a display apparatus in a reset period, in accordance with some embodiments.
Figure 10:
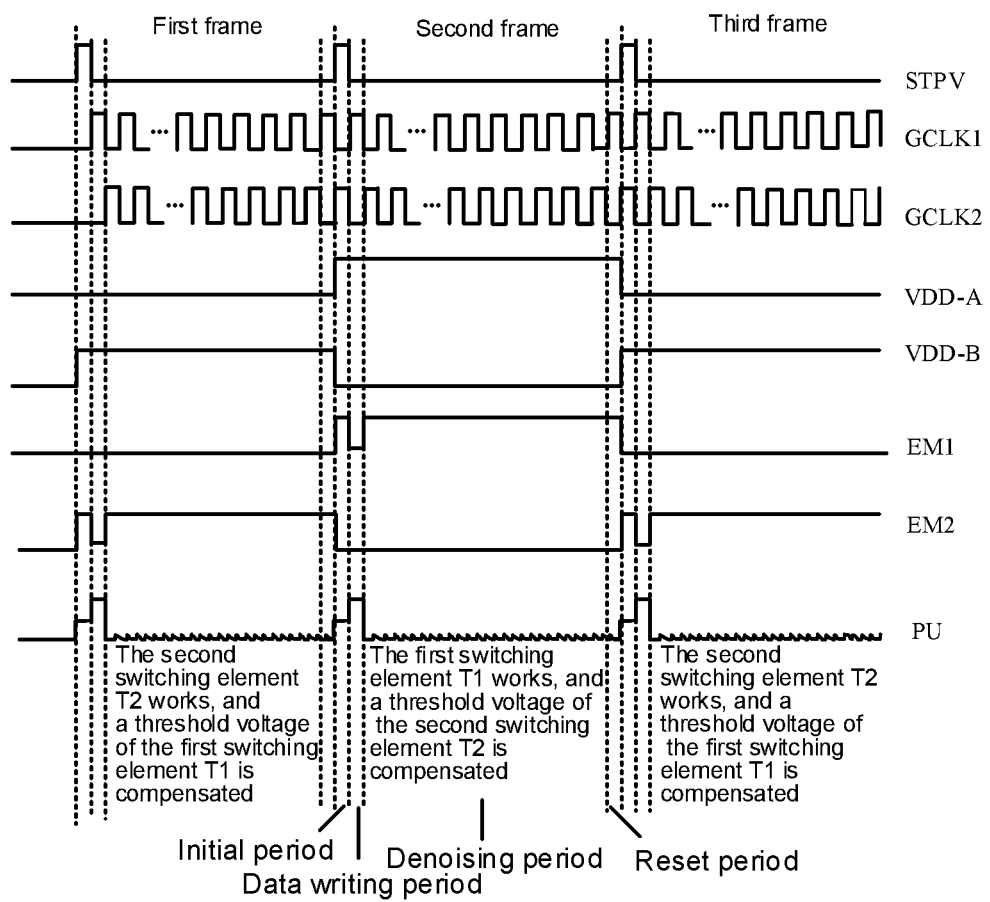
FIG. 10 is a timing diagram of a driving method for a shift register, in accordance with some embodiments.

Referring to FIG. 9, in combination with the second frame shown in FIG. 10, in the reset period, the second reset signal terminal RST2 outputs a second level, and the twelfth switching element T12 and the fourteenth switching element T14 are turned on, so that the second voltage terminal LVGL2 is coupled to the second node PU, and the first voltage terminal LVGL1 is coupled to the first node Output, so as to reset the second node PU and the first node Output. The second reset signal terminal RST2 may input a second reset signal after one frame is completed to discharge the second node PU again, so that occurrence of multiple outputs may be avoided, and driving of the entire frame is completed. In this period, the seventh switching element T7, the eighth switching element T8, the tenth switching element T10, the eleventh switching element T11, the ninth switching element T9, the fourth switching element T4, and the sixth switching element T6 are turned off.

Referring to FIG. 10, the embodiments of the present disclosure are described by considering an example in which one frame lasts for an alternate switching time of levels of the first signal terminal VDD-A and the second signal terminal VDD-B. In a first frame, the second switching element T2 works, and a threshold voltage of the first switching element T1 is compensated. In the second frame, the first switching element T1 works, and the threshold voltage of the second switching element T2 is compensated. Subsequently, processes of the first frame and the second frame are repeated. That is, the process of the first frame is repeated in a third frame, the process of the second frame is repeated in a fourth frame, so that the first switching element T1 and the second switching element T2 are compensated at different times. In this way, positive and negative pressures to which the first switching element T1 and the second switching element T2 are subjected are switched, so that it is possible to ensure that the threshold voltages are not greatly shifted. In practical applications, the alternate switching time of the levels of the first signal terminal VDD-A and the second signal terminal VDD-B is not limited to one frame, and may also be several seconds, such as one second, two seconds, or three seconds.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register, comprising:
    a voltage control circuit coupled to a first node, and configured to control a voltage at the first node to be one of a first voltage and a second voltage; and
    a bias compensation circuit coupled to the first node, a first voltage terminal, a first signal terminal, a second signal terminal, a first signal output terminal and a second signal output terminal, and configured to: when the voltage at the first node is the first voltage, transmit a first signal received by the first signal terminal to the first signal output terminal, and transmit a second signal received by the second signal terminal to the second signal output terminal; and in response to the voltage at the first node being the second voltage, transmit a signal received by the first voltage terminal to the first signal output terminal and the second signal output terminal; wherein
    the bias compensation circuit includes:
        a third switching element, a control electrode of the third switching element being coupled to the first signal terminal or a third voltage terminal, a first electrode of the third switching element being coupled to the first signal terminal, and a second electrode of the third switching element being coupled to the first signal output terminal;
        a fourth switching element, a control electrode of the fourth switching element being coupled to the first node, a first electrode of the fourth switching element being coupled to the first signal output terminal, and a second electrode of the fourth switching element being coupled to the first voltage terminal;
        a fifth switching element, a control electrode of the fifth switching element being coupled to the second signal terminal or the third voltage terminal, a first electrode of the fifth switching element being coupled to the second signal terminal, and a second electrode of the fifth switching element being coupled to the second signal output terminal; and
        a sixth switching element, a control electrode of the sixth switching element being coupled to the first node, a first electrode of the sixth switching element being coupled to the second signal output terminal, and a second electrode of the sixth switching element being coupled to the first voltage terminal, wherein
        the third voltage terminal is configured to provide a signal for controlling the third switching element and the fifth switching element to be in turn-on states.

2. The shift register according to claim 1, wherein the voltage control circuit includes:
    an output sub-circuit coupled to a clock signal terminal, a second node and the first node, and configured to transmit a clock signal received by the clock signal terminal to the first node in response to a voltage at the second node, so as to make the voltage at the first node be the first voltage or the second voltage; and
    a denoising sub-circuit coupled to the first voltage terminal, the first node and a third node, and configured to control the voltage at the first node to be the first voltage in response to a voltage at the third node.

3. The shift register according to claim 2, wherein the output sub-circuit includes:
    an eleventh switching element, a control electrode of the eleventh switching element being coupled to the second node, a first electrode of the eleventh switching element being coupled to the clock signal terminal, and a second electrode of the eleventh switching element being coupled to the first node.

4. The shift register according to claim 2, wherein the output sub-circuit is further configured to raise or lower the voltage at the second node in response to the voltage at the first node being the second voltage; or
    the output sub-circuit is further configured to raise or lower the voltage at the second node in response to the voltage at the first node being the second voltage; and the output sub-circuit further includes an energy storage element, a first electrode plate of the energy storage element is coupled to the first node, and a second electrode plate of the energy storage element is coupled to the second node.

5. The shift register according to claim 2, wherein the output sub-circuit is further coupled to a third signal output terminal, and is further configured to transmit the clock signal received by the clock signal terminal to the third signal output terminal in response to the voltage at the second node.

6. The shift register according to claim 5, wherein the output sub-circuit further includes:
a tenth switching element, a control electrode of the tenth switching element being coupled to the second node, a first electrode of the tenth switching element being coupled to the clock signal terminal, and a second electrode of the tenth switching element being coupled to the third signal output terminal.

7. The shift register according to claim 2, wherein the denoising sub-circuit includes:
a seventeenth switching element, a control electrode of the seventeenth switching element being coupled to the third node, a first electrode of the seventeenth switching element being coupled to the first node, and a second electrode of the seventeenth switching element being coupled to the first voltage terminal.

8. The shift register according to claim 2, wherein the denoising sub-circuit is further coupled to a third signal terminal, and is further configured to transmit a third signal received by the third signal terminal to the third node in response to the third signal received by the third signal terminal; or
the denoising sub-circuit is further coupled to a third signal terminal, and is further configured to transmit a third signal received by the third signal terminal to the third node in response to the third signal received by the third signal terminal; and the denoising sub-circuit further includes a fifteenth switching element, a control electrode and a first electrode of the fifteenth switching element are both coupled to the third signal terminal, and a second electrode of the fifteenth switching element is coupled to the third node.

9. The shift register according to claim 2, wherein the denoising sub-circuit is further coupled to a second voltage terminal and a third signal output terminal, and is further configured to transmit a signal received by the second voltage terminal to the third signal output terminal in response to the voltage at the third node.

10. The shift register according to claim 9, wherein the denoising sub-circuit further includes:
a sixteenth switching element, a control electrode of the sixteenth switching element being coupled to the third node, a first electrode of the sixteenth switching element being coupled to the third signal output terminal, and a second electrode of the sixteenth switching element being coupled to the second voltage terminal.

11. The shift register according to claim 1, further comprising:
an input circuit coupled to a signal input terminal, a second node, a third node and a second voltage terminal, and configured to control a voltage at the second node and a voltage at the third node in response to an input signal received by the signal input terminal.

12. The shift register according to claim 11, wherein the input circuit includes:

a seventh switching element, a control electrode and a first electrode of the seventh switching element being both coupled to the signal input terminal, and a second electrode of the seventh switching element being coupled to the second node; and
a ninth switching element, a control electrode of the ninth switching element being coupled to the second node, a first electrode of the ninth switching element being coupled to the third node, and a second electrode of the ninth switching element being coupled to the second voltage terminal; or
the input circuit includes:
a seventh switching element, a control electrode and a first electrode of the seventh switching element being both coupled to the signal input terminal, and a second electrode of the seventh switching element being coupled to the second node;
a ninth switching element, a control electrode of the ninth switching element being coupled to the second node, a first electrode of the ninth switching element being coupled to the third node, and a second electrode of the ninth switching element being coupled to the second voltage terminal; and
an eighth switching element, a control electrode of the eighth switching element being coupled to the signal input terminal, a first electrode of the eighth switching element being coupled to the third node, and a second electrode of the eighth switching element being coupled to the second voltage terminal.

13. The shift register according to claim 1, further comprising:
a reset circuit coupled to a first reset signal terminal, a second node and a second voltage terminal, and configured to transmit a signal received by the second voltage terminal to the second node in response to a first reset signal received by the first reset signal terminal.

14. The shift register according to claim 13, wherein the reset circuit includes:
a thirteenth switching element, a control electrode of the thirteenth switching element being coupled to the first reset signal terminal, a first electrode of the thirteenth switching element being coupled to the second voltage terminal, and a second electrode of the thirteenth switching element being coupled to the second node.

15. The shift register according to claim 13, wherein the reset circuit is further coupled to a second reset signal terminal and the first voltage terminal, and the reset circuit is further configured to: transmit the signal received by the second voltage terminal to the second node in response to a second reset signal received by the second reset signal terminal; and transmit the signal received by the first voltage terminal to the first node in response to the second reset signal received by the second reset signal terminal, so as to make the voltage at the first node be the first voltage.

16. The shift register according to claim 15, wherein the reset circuit further includes:
a twelfth switching element, a control electrode of the twelfth switching element being coupled to the second reset signal terminal, a first electrode of the twelfth switching element being coupled to the second node, and a second electrode of the twelfth switching element being coupled to the second voltage terminal; and
a fourteenth switching element, a control electrode of the fourteenth switching element being coupled to the second reset signal terminal, a first electrode of the fourteenth switching element being coupled to the first node, and a second electrode of the fourteenth switching element being coupled to the first voltage terminal.

17. A display apparatus, comprising:
the shift register according to claim 1; and
a pixel driving circuit, wherein the pixel driving circuit includes a first switching element and a second switching element; a control electrode of the first switching element is coupled to the first signal output terminal of the shift register, and a control electrode of the second switching element is coupled to the second signal output terminal of the shift register; a first electrode of the first switching element is coupled to a first electrode of the second switching element, and a second electrode of the first switching element is coupled to a second electrode of the second switching element.

18. A driving method for a shift register, the shift register being coupled to a first node, a first signal terminal, a second signal terminal, a first signal output terminal, a second signal output terminal and a first voltage terminal, the shift register including a third switching element, a fourth switching element, a fifth switching element and a sixth switching element, a control electrode of the third switching element being coupled to the first signal terminal, a first electrode of the third switching element being coupled to the first signal terminal, a second electrode of the third switching element being coupled to the first signal output terminal, a control electrode of the fourth switching element being coupled to the first node, a first electrode of the fourth switching element being coupled to the first signal output terminal, a second electrode of the fourth switching element being coupled to the first voltage terminal, a control electrode of the fifth switching element being coupled to the second signal terminal, a first electrode of the fifth switching element being coupled to the second signal terminal, a second electrode of the fifth switching element being coupled to the second signal output terminal, a control electrode of the sixth switching element being coupled to the first node, a first electrode of the sixth switching element being coupled to the second signal output terminal, a second electrode of the sixth switching element being coupled to the first voltage terminal, and the driving method for the shift register comprising:
controlling a voltage at the first node to be one of a first voltage and a second voltage;
when the voltage at the first node is the first voltage, transmitting a first signal received by the first signal terminal to the first signal output terminal, and transmitting a second signal received by the second signal terminal to the second signal output terminal, wherein the fourth switching element and the sixth switching element are turned off due to action of the first voltage, and the third switching element is turned on due to action of the first signal, so that the first signal output from the first signal terminal is transmitted to the first signal output terminal through the third switching element, and the fifth switching element is turned on due to action of the second signal, so that the second signal output from the second signal terminal is transmitted to the second signal output terminal through the fifth switching element; and
in response to the voltage at the first node being the second voltage, transmitting a signal received by the first voltage terminal to the first signal output terminal and the second signal output terminal through the fourth switching element, the sixth switching element and one of the third switching element and the fifth switching element being turned on; wherein
the first signal and the second signal are both rectangular wave signals, and have opposite levels.

19. The driving method for the shift register according to claim 18, wherein
the first signal and the second signal are both square wave signals.

20. A driving method for a shift register, the shift register being coupled to a first node, a first signal terminal, a second signal terminal, a first signal output terminal, a second signal output terminal, a first voltage terminal and a third voltage terminal, the shift register including a third switching element, a fourth switching element, a fifth switching element and a sixth switching element, a control electrode of the third switching element being coupled to third voltage terminal, a first electrode of the third switching element being coupled to the first signal terminal, a second electrode of the third switching element being coupled to the first signal output terminal, a control electrode of the fourth switching element being coupled to the first node, a first electrode of the fourth switching element being coupled to the first signal output terminal, a second electrode of the fourth switching element being coupled to the first voltage terminal, a control electrode of the fifth switching element being coupled to the third voltage terminal, a first electrode of the fifth switching element being coupled to the second signal terminal, a second electrode of the fifth switching element being coupled to the second signal output terminal, a control electrode of the sixth switching element being coupled to the first node, a first electrode of the sixth switching element being coupled to the second signal output terminal, a second electrode of the sixth switching element being coupled to the first voltage terminal, and the driving method for the shift register comprising:
controlling a voltage at the first node to be one of a first voltage and a second voltage;
when the voltage at the first node is the first voltage, transmitting a first signal received by the first signal terminal to the first signal output terminal, and transmitting a second signal received by the second signal terminal to the second signal output terminal, wherein the third voltage terminal is used to provide a signal for controlling the third switching element and the fifth switching element to be in turn-on states, so that the third switching element and the fifth switching element always remain in turn-on states, the first signal output from the first signal terminal and the second signal output from the second signal terminal are directly transmitted to the first signal output terminal and the second signal output terminal through the third voltage terminal and the fifth switching element, respectively; and
in response to the voltage at the first node being the second voltage, transmitting a signal received by the first voltage terminal to the first signal output terminal and the second signal output terminal through the fourth switching element, the sixth switching element, the third switching element and the fifth switching element being turned on; wherein
the first signal and the second signal are both rectangular wave signals, and have opposite levels.

* * * * *